United States Patent [19]

Tanigawa et al.

[11] Patent Number: 5,296,763

[45] Date of Patent: * Mar. 22, 1994

[54] POLAR LEAPFROG FILTER

[75] Inventors: Hiroshi Tanigawa; Hiroshi Kondo; Isao Fukai; Tsuneo Tohyama, all of Tsurugashima, Japan

[73] Assignee: Toko, Inc., Tokyo, Japan

[*] Notice: The portion of the term of this patent subsequent to Jan. 26, 2010 has been disclaimed.

[21] Appl. No.: 858,010

[22] Filed: Mar. 26, 1992

[30] Foreign Application Priority Data

Mar. 29, 1991 [JP] Japan .................................. 3-89439

[51] Int. Cl.$^5$ ............................................. H03F 3/04
[52] U.S. Cl. ................................. 307/520; 328/167; 330/107
[58] Field of Search ................. 307/520, 521; 328/127, 328/167; 330/107, 85

[56] References Cited

U.S. PATENT DOCUMENTS

| | | | |
|---|---|---|---|
| 3,986,127 | 10/1976 | Ray | 328/128 |
| 5,177,382 | 1/1993 | Kondo et al. | 307/520 |
| 5,182,522 | 1/1993 | Tanigawa et al. | 307/520 |
| 5,216,375 | 6/1993 | Tanigawa et al. | 307/494 |

Primary Examiner—Timothy R. Callahan

[57] ABSTRACT

A polar leapfrog filter includes at least one polar network. The polar network comprises a differentiator constituted by an operational amplifier having input and output terminals, and a first integrator formed by a first capacitor for providing negative feedback to the operational amplifier and a first variable transconductance amplifier; and a second integrator formed by a second capacitor for providing negative feedback to the first integrator, and a second variable transconductance amplifier. In the case where two or more said polar networks are incorporated, an integrator is provided between adjacent ones of the polar networks. The total number of all the circuits is selected to be odd and equal to the order of the filter. The adjacent ones of the circuits are connected in such a manner that leapfrog type negative feedback is effected.

7 Claims, 12 Drawing Sheets

POLAR LEAPFROG FILTER

BACKGROUND OF THE INVENTION

1. Field of the Invention

The present invention relates to a polar leapfrog filter which can be constructed in the form of an active filter, and more particularly it pertains to an odd-order polar leapfrog low-pass filter.

2. Description of the Prior Art

Figure 1:
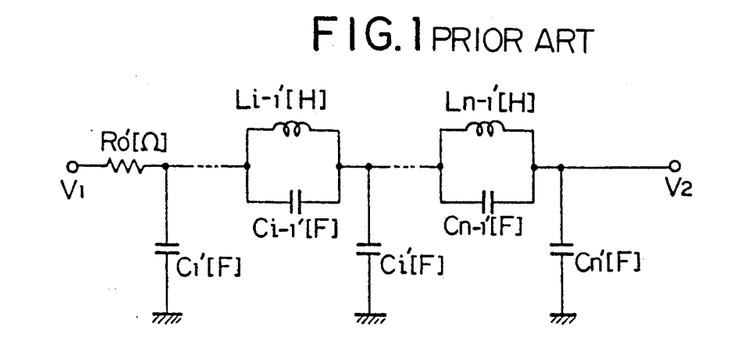
FIG. 1 illustrates an example of conventional odd-order passive low-pass filter.
Figure 2:
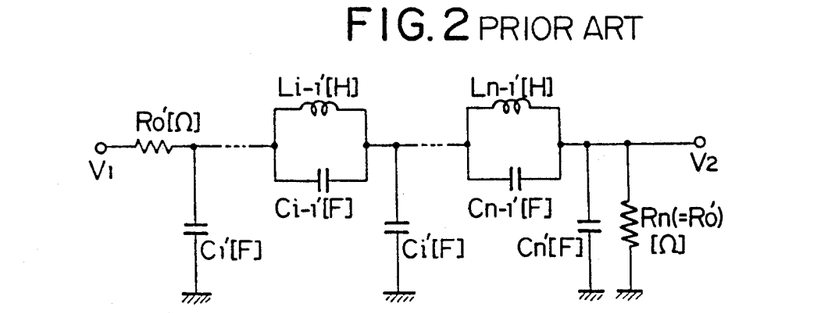
FIG. 2 illustrates another example of conventional odd-order passive low-pass filter.

Heretofore, such passive filters as shown in FIGS. 1 and 2 have been widely used. However, it is the recent trend that so-called active filters are employed in lieu of such passive filters, as the result of peripheral circuits associated therewith being constructed in the form of semiconductor integrated circuit. Generally, an active filter is made up of components, each of which comprises a resistor, a capacitor, and an operational amplifier, and constructed in the form of a sallen-key circuit, a biquad circuit or an FDNR (frequency-dependent negative resistance) circuit by combining such operational amplifiers. Alternatively, a desired filter is constructed by using such circuits as units. In an attempt to change the filter characteristics, with the biquad circuit or the like, it is required that the constants for the resistors and capacitors be changed. With the FDNR filter, on the other hand, difficulties are experienced in an attempt to adjust the filter characteristics thereof since it is the usual practice that several such filters are interconnected with each other and it is required that constants for the elements of each such filter be changed. The other types of filter use variable resistors to make variable the filter characteristics thereof; thus, such filters are constructed inevitably in the form of a hybrid integrated circuit. Alternatively, it is required that chip components of a predetermined resistance value be pre-selected and mounted onto a printed circuit board, which disadvantageously leads to a increase in the size of the filter. In either case, such filters are disadvantageous in that they cannot be constructed in the form of a monolithic integrated circuit since the variable resistors or the pre-selected chip components should be mounted onto the printed circuit board as mentioned above.

In an attempt to make a Cauer filter or the like or achieve desired filter characteristics, it is required that the filter be constructed in the form of polar type having a damping pole, i.e., transmission zero point (pole zero) at a definite frequency. With the above-mentioned conventional arrangements, however, when it is attempted to achieve this, problems arise in that a number of parts are required so that the circuit arrangement turns out to be complicated and difficulties are encountered in an attempt to achieve an odd-order arrangement, though an even-order arrangement is achievable, as is the case with a biquad circuit. The problems with a filter constructed in the form of a hybrid integrated circuit having a number of parts mounted on a printed circuit board, are such that most such filters are bulky and difficult to adjust the filter characteristics thereof.

SUMMARY OF THE INVENTION

It is an object of the present invention to provide a polar leapfrog filter constructed in accordance with the leapfrog simulation procedure (refer to M. E. Van Valkenburg: "Analog Filter Design", 1982, CBS College Publishing), thereby eliminating the above-described drawbacks of the prior art.

The present invention employs the leapfrog simulation procedure as mentioned just above, and it is also based on the invention disclosed in U.S. patent application Ser. No. 798,215 filed Nov. 26, 1991, now U.S. Pat. No. 5,177,382, corresponding to Japanese Patent Application No. 333136/1990 filed Nov. 29, 1990.

An important advantage of the present invention is such that a Cauer filter can be very easily achieved according to the present invention. Another important advantage is such that a higher order filter can be easily constructed. Still another important advantage is such that the filter according to the present invention can readily be constructed in the form of semiconductor integrated circuit since the main elements of the filter are integrators, so that the number of parts thereof as well as the size thereof can be reduced.

Furthermore, the polar leapfrog filter according to the present invention is advantageous in that since the main constitutional elements thereof are integrators each comprising a variable transconductance amplifier, the pass bandwidth thereof can be easily adjusted by adjusting current supplied to the differential transistor pair of such variable transconductance amplifier to cause the internal resistance of such transistor pair to be changed.

Other objects, features and advantages of the present invention will become apparent from the ensuing description taken in conjunction with the accompanying drawings.

DESCRIPTION OF THE PREFERRED EMBODIMENTS

Description will now be made of embodiments of the present invention with reference to FIGS. 3 to 12.

Figure 3:
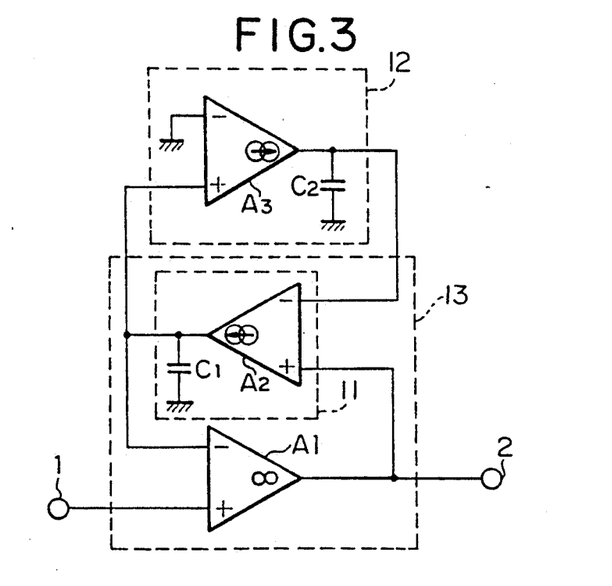
FIG. 3 is a circuit diagram showing an example of polar network which is used as a constitutional element of the polar leapfrog filter according to the present invention.

Referring to FIG. 3, an input terminal 1 is connected to a non-inverting input terminal of an operational amplifier $A_1$ of a substantially infinite gain, and an output terminal 2 is led out of the output terminal of the operational amplifier $A_1$. The output terminal of the operational amplifier $A_1$ is connected to a non-inverting input terminal of a variable transconductance amplifier $A_2$, the output terminal of which is coupled to an inverting input terminal of the operational amplifier $A_1$ and grounded through a capacitor $C_1$. The variable transconductance amplifier $A_2$ and the capacitance $C_1$ constitute an integrator 11 which is arranged to provide negative feedback to the operational amplifier $A_1$. The operational amplifier $A_1$ and the integrator 11 constitute a differentiator 13. Further, the output terminal of the variable transconductance amplifier $A_2$ is connected to a non-inverting input terminal of another variable transconductance amplifier $A_3$, the output terminal of which is grounded through a second capacitor $C_2$ and connected to an inverting input terminal of the variable transconductance amplifier $A_2$. A second integrator 12 is constituted by the variable transconductance amplifier $A_3$ and the capacitor $C_2$. An inverting input terminal of the variable transconductance amplifier $A_3$ is grounded.

Figure 5:
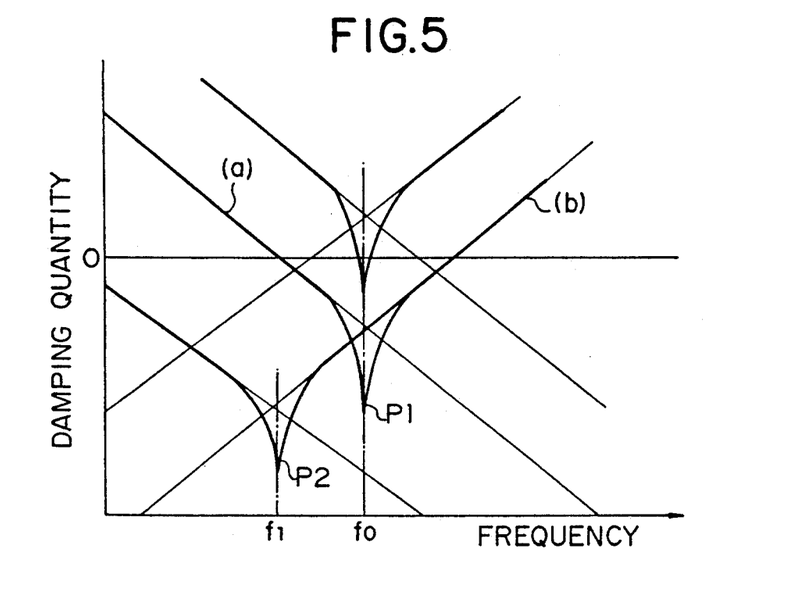
FIG. 5 illustrates the frequency characteristics of the polar network shown in FIG. 3.

As will be appreciated from the above explanation, the circuit of FIG. 3 is a negative feedback circuit comprising in combination the integrator 12 and differentiator 13 and which represents a damping pole (pole zero) at a predetermined frequency as will be seen from FIG. 5. Thus, the circuit of FIG. 3 comprises a polar type circuit having a damping pole, which will be referred to as "polar network" hereinafter.

The polar network of FIG. 3 has a damping pole which occurs at a point where the filter characteristics (a) and (b) of the integrator 12 and differentiator 13 as combined cross each other, as shown in FIG. 5. It is possible to shift the damping pole by adjusting the operating currents of the variable transconductance amplifiers $A_2$ and $A_3$ to set up the transconductances $gm_1$ and $gm_2$ of variable transconductance amplifiers $A_2$ and $A_3$. By adjusting the operating current of the variable transconductance amplifier $A_3$ constituting the integrator 12, for example, it is possible to cause the damping pole to be shifted from $P_1$ at a frequency $f_0$ to $P_2$ at a frequency $f_1$. Further, by adjusting the operating currents of the variable transconductance amplifiers $A_2$ and $A_3$ constituting the integrators 11 and 12 respectively at the same time and in the same direction, it is possible to change the damping quantity alone, while keeping the damping pole at the predetermined frequency $f_0$.

The block diagram of FIG. 4D corresponds to the polar network of FIG. 3; thus, it will be explained that the network of FIG. 3 can be converted directly from the block diagram of FIG. 4D. As mentioned above, the polar network of FIG. 3 is a negative feedback circuit comprising the integrator 12 and differentiator 13 in combination; thus, the transfer function of the polar network shown in FIG. 3 is equivalent to a sum of the transfer functions of the integrator 12 and differentiator 13. In this way, assuming that the transfer functions of the differentiator and integrator are represented by $sC_1/gm_1$ and $gm_2/sC_2$ respectively, the transfer function of the polar network shown in FIG. 3 is given as follows:

$$V_2/V_1 = sC_1/gm_1 + gm_2/sC_2 \quad (1)$$

where $V_1$ is an input voltage, $V_2$ is an output voltage, and $gm_1$ and $gm_2$ are the transconductances of the variable transconductance amplifiers $A_2$ and $A_3$ respectively.

Figure 4A:
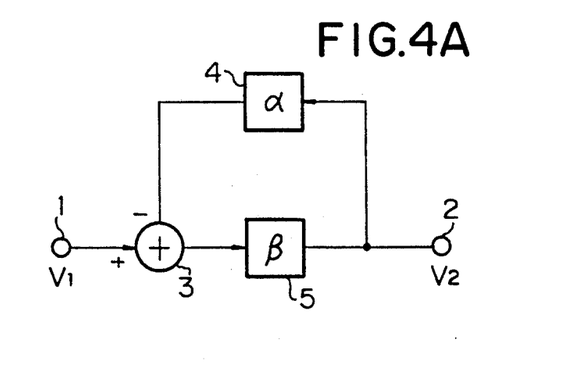
FIGS. 4A to 4D are block diagrams useful for explaining about the polar network of FIG. 3.
Figure 4B:
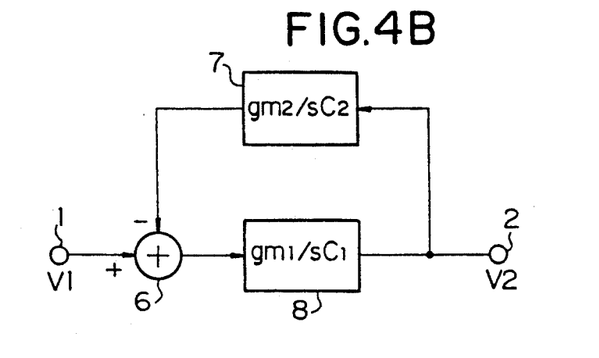
Figure 4C:
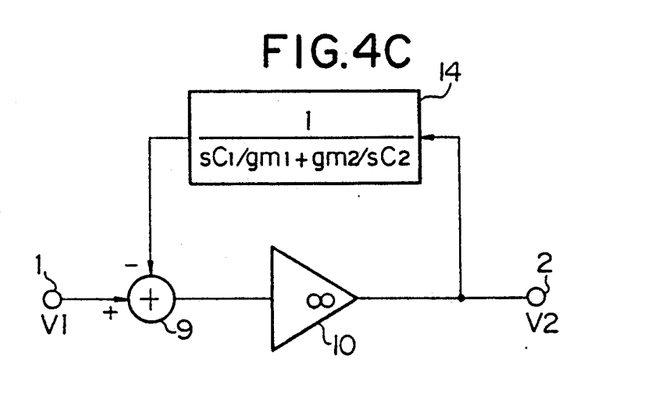

FIG. 4A is a block diagram illustrating a common negative feedback circuit comprising an adder 3, and blocks 4 and 5. FIG. 4B is a block diagram wherein an integrator having a predetermined transfer function is provided in each of blocks 7 and 8 which correspond to the blocks 4 and 5 of FIG. 4A respectively. FIG. 4C illustrates an arrangement in which blocks 10 and 14 corresponding to the blocks 4 and 5 of FIG. 4A are constituted by an operational amplifier having an infinite gain and a block having a predetermined transfer function, respectively. FIG. 4D is a block diagram showing the above-mentioned polar network which is constituted by the blocks of FIGS. 4B and 4C. The polar network of FIG. 3 can be realized through direct transformation of the blocks of FIG. 4D.

The transfer function given by the equation (1) will now be sought. The transfer function of the arrangement shown in FIG. 4A, which comprises the blocks of a negative feedback circuit called basic feedback system, is given by equation (2) as follows:

$$(V_1 - \alpha V_2)\beta = V_2 \quad (2)$$

where $\alpha$ is the variable of the block 4, and $\beta$ is the variable of the block 5.

Thus, from the equation (2), the transfer function of the block diagram shown in FIG. 4A is given as follows:

$$V_2/V_1 = 1/(\alpha + 1/\beta) \quad (3)$$

In the block diagram of FIG. 4A, let it be assumed that the variables $\alpha$ and $\beta$ are substituted with integrator transfer functions as shown below.

$$\alpha = gm_2/sC_2$$

$$\beta = gm_1/sC_1 \quad (4)$$

Then, the block diagram of FIG. 4A can be transformed to the block diagram of FIG. 4B comprising blocks 7 and 8. Thus, by substituting the equation (4) for the equation (3), the transfer function can be expressed as follows:

$$V_2/V_1 = 1/(sC_1/gm_1 + gm_2/sC_2) \quad (5)$$

Further, the variables $\alpha$ and $\beta$ of the blocks 4 and 5 in the block diagram of FIG. 4A are rewritten as follows:

$$\alpha = 1/(sC_1/gm_1 + gm_2/sC_2)$$

$$\beta = \infty \quad (6)$$

The resulting block diagram turns out to be as shown in FIG. 4C, the transfer function of which is given as follows, by substituting the equations (6) for the variables α and β in the equation (3):

$$V_2/V_1 = sC_1/gm_1 + gm_2/sC_2 \qquad (7)$$

The equation (7) indicates that the block diagram of FIG. 4C provides a transfer function which is equivalent to one obtained by adding up the characteristics of the differentiator and integrator such as represented by the equation (1).

The transfer function of the block 14 shown in FIG. 4C is given as $1/(sC_1/gm_1 + gm_2/sC_2)$, which is identical with the transfer function represented by the equation (5).

Figure 4D:
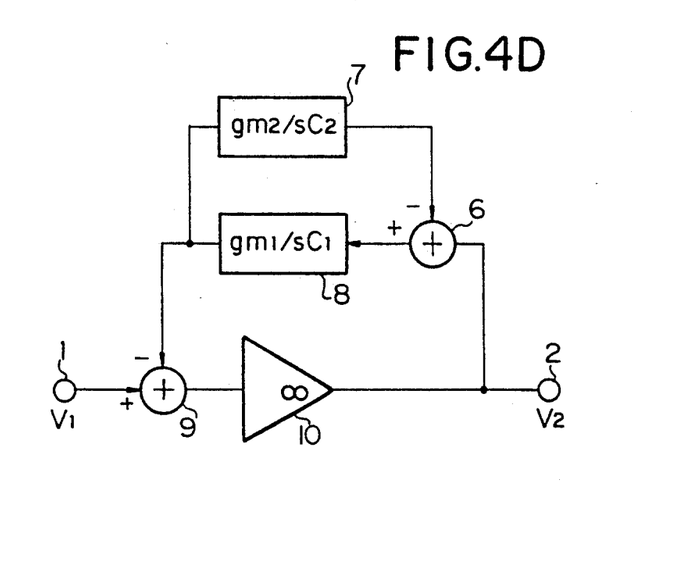

Thus, by combining the block diagrams of FIGS. 4B and 4C, the transfer function of the equation (7) can be illustrated as in the block diagram of FIG. 4D. In this way, it has been found that the block diagram of FIG. 4D can be transformed to the circuit arrangement of FIG. 3.

As will be appreciated from the above discussion, according to the present invention, an odd-order polar leapfrog filter is constructed on the basis of the matters explained hereinabove with reference to FIGS. 3 to 5. The odd-order leapfrog filter is arranged such that in the case where at least one said polar network is incorporated therein, an integrator is provided at each of the input and output portions thereof; in the case where two or more said polar networks are incorporated therein, an integrator is provided between said polar networks, the number of all the circuits being selected to be odd and equal to the order of the filter; and leapfrog type negative feedback is provided between respective adjacent ones of the above-mentioned circuits.

Figure 8:
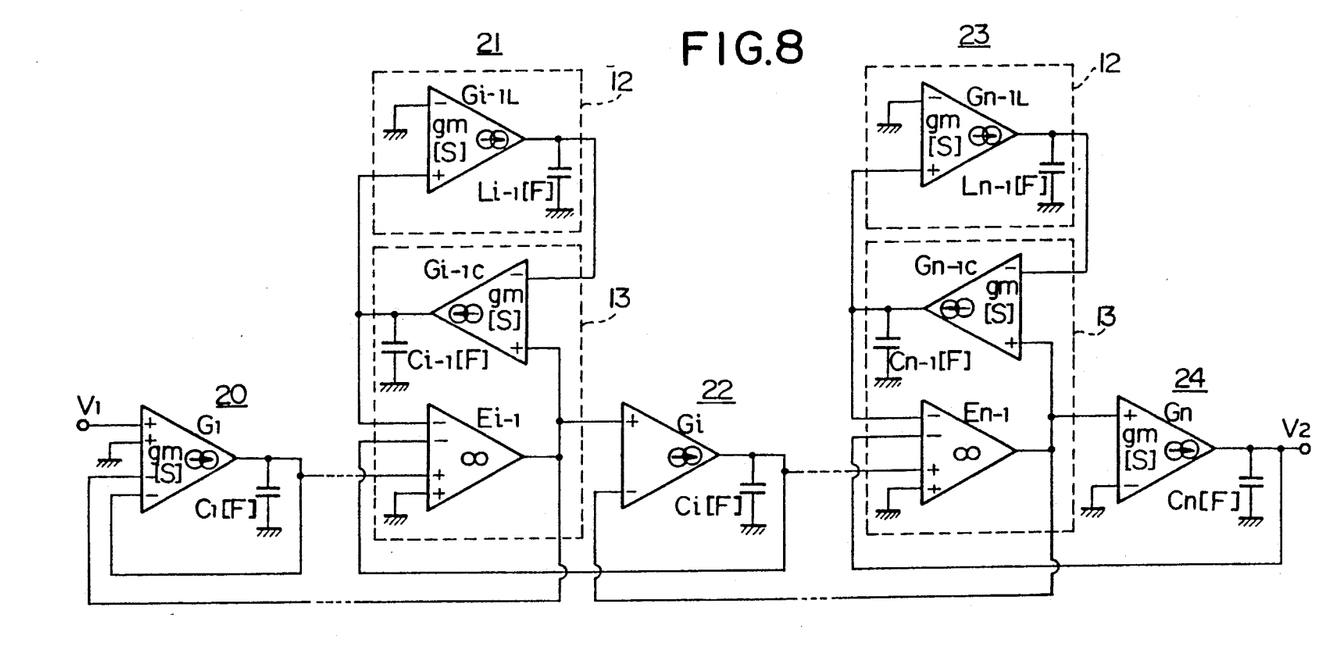
FIG. 8 is a circuit diagram showing the polar leapfrog filter according to an embodiment of the present invention which is constructed by transforming the passive filter shown in FIG. 1.

Referring to FIG. 1, there is shown a conventional odd-order passive LPF (low-pass filter) having no terminal resistor, where n is an odd number which is equal to or greater than 3. Referring to FIG. 8, there is illustrated the polar leapfrog filter according to an embodiment of the present invention, which is achieved by transforming the passive filter of FIG. 1 to an active filter in accordance with the leapfrog simulation procedure mentioned in the preamble portion of the present specification.

Description will now be made of the process of designing the active filter of FIG. 8, which is equivalent to the passive filter of FIG. 1, by using the leapfrog simulation procedure.

In FIG. 1, the element values and frequency are subjected to scaling so that the value for $R_0'$ and the cut-off frequency $\omega_0$ become equal to 1 and 1 rad/sec respectively. Assuming that the values for the resistor, capacitor and coil, after having been subjected to the scaling, are $R''$, $C''$ and $L''$ respectively, these values are given as follows (such values have no unit):

$$R'' = R'/R_0' [-]$$

$$C'' = \omega_0 C' R_0' [-]$$

$$L'' = \omega_0 L'/R_0' [-] \qquad (8)$$

With the coil being regarded as identical with the capacitor, the element values and cut-off frequency are again subjected to scaling so that the the value for $R''$ becomes equal to $1\Omega$ and the cut-off frequency becomes the original value. Assuming that the values for the resistor, capacitor and coil, after having been subjected to scaling, are $R'''$, $C'''$ and $L'''$ respectively, such values are given as follows:

$$R''' = R'' \cdot 1 = R'/R_0' [\Omega]$$

$$C''' = C''/\omega_0 = C'/R_0' [F]$$

$$L''' = L''/\omega_0 = L'/R_0' = (L'/R_0'^2)R_0' [F] \qquad (9)$$

By letting $R_0' = 1/gm$, the equations (9) can be rewritten as follows:

$$R''' = R' gm [\Omega]$$

$$C''' = C'/gm [F]$$

$$L''' = (L' gm^2)/gm [F] \qquad (10)$$

Figure 6A:
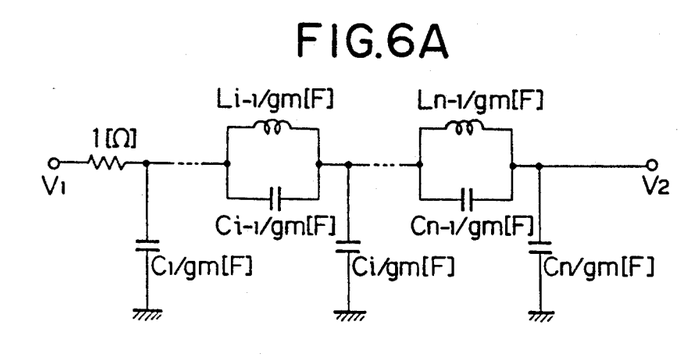
FIG. 6A illustrates an arrangement achieved by scaling the arrangement of FIG. 1.

As a result of the above successive scaling procedures, the element values in FIG. 1 are transformed as shown in FIG. 6A wherein the respective element values are given by equations (11a) to (11f) respectively. In this case, $gm = 1/R_0'$.

$$C_1 = C_1' [F]$$

$$C_{i-1} = C_{i-1}' [F]$$

$$L_{i-1} = L_{i-1}' gm^2 [F]$$

$$C_{n-1} = C_{n-1}' [F]$$

$$L_{n-1} = L_{n-1}' gm^2 [F]$$

$$C_n = C_n' [F] \qquad (11)$$

Figure 6B:
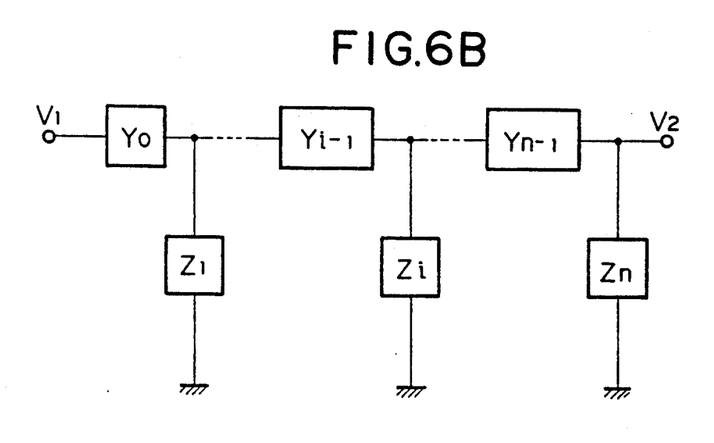
FIG. 6B illustrates the arrangement of FIG. 6A as represented by using admittance and impedance.

In FIG. 6A, by representing the floating elements in the form of admittance Y and the grounded elements in the form of impedance Z, FIG. 6A can be transformed to FIG. 6B. The respective admittance and impedance values in FIG. 6B are given as shown by equations (12) as follows:

$$Y_0 = 1$$

$$Z_1 = gm/sC_1$$

$$Y_{i-1} = sC_{i-1}/gm + gm/sL_{i-1}$$

$$Z_i = gm/sC_i$$

$$Y_{n-1} = sC_{n-1}/gm + gm/sL_{n-1}$$

$$Z_n = gm/sC_n \qquad (12)$$

In the equations (12), each admittance and impedance can be regarded as constituting a transfer function; thus, the transfer functions can be expressed as indicated by equations (13) as follows:

$$T_0 = 1$$

$$T_1 = gm/sC_1$$

$$T_{i-1} = sC_{i-1}/gm + gm/sL_{i-1}$$

$$T_i = gm/sC_i$$

$$T_{n-1} = sC_{n-1}/gm + gm/sL_{n-1}$$

$$T_n = gm/sC_n \tag{13}$$

Figure 7A:
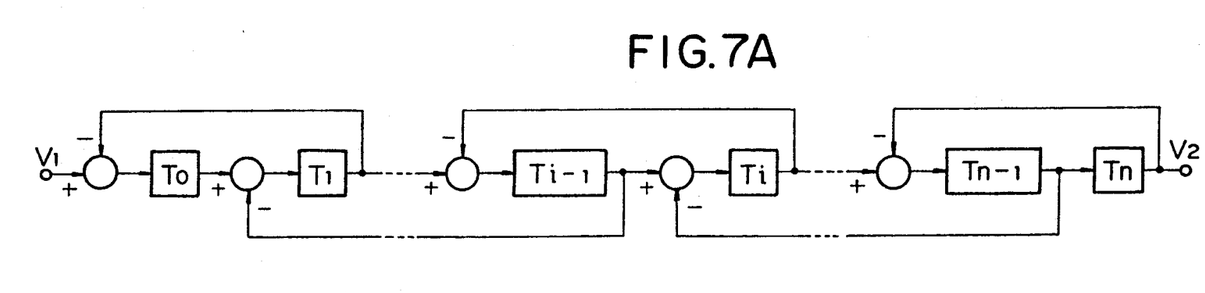
FIG. 7A illustrates signal flow developed in accordance with the leapfrog simulation procedure.

The arrangement of FIG. 6B can be developed into such a signal flow as shown in FIG. 7A, in accordance with the leapfrog simulation procedure disclosed in the "Analog Filter Design" cited in the preamble portion of the present specification. In FIG. 7A, the characters in the respective blocks represent transfer functions corresponding to the equations (13) respectively, and the circles indicate adders.

Figure 7B:
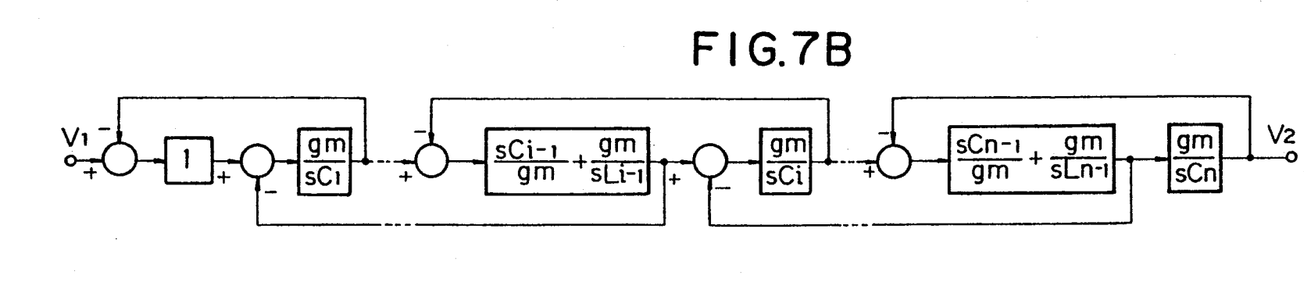
FIG. 7B illustrates an arrangement transformed from that of FIG. 7A.

By putting the equations (13) in the respective blocks of FIG. 7A, the arrangement of FIG. 7A is transformed to that of FIG. 7B. Recall that the block 14 can be rewritten as shown in FIG. 4D as mentioned hereinbefore; by putting such relationship in FIG. 7B, the arrangement of FIG. 7B can be transformed to that of FIG. 7C.

Figure 7C:
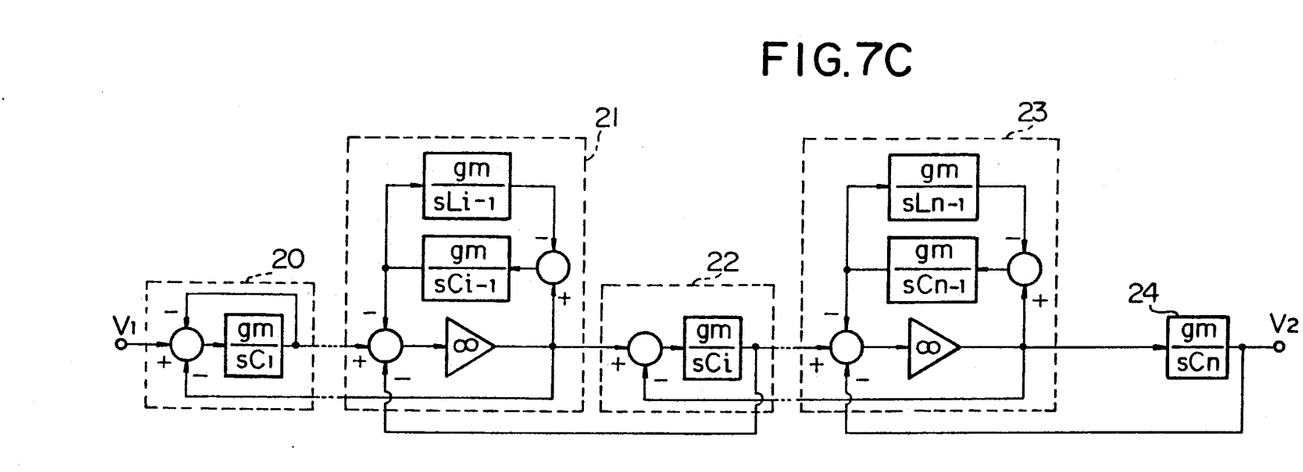
FIG. 7C illustrates an arrangement transformed from that of FIG. 7B.

Furthermore, from the fact the polar network of FIG. 3 can be achieved through direct transformation from the block diagram of FIG. 4D, it is possible to construct such a circuit arrangement as shown in FIG. 8, by putting the relationship between FIG. 4D and FIG. 3 in the arrangement of FIG. 7C in which the block 20 is a self feedback type integrator: the blocks 21 and 23 are polar networks; the blocks 22 and 24 are integrators; and leapfrog type negative feedback is provided to each of the blocks except for the block 24. The circuit arrangement of FIG. 7C constitutes the odd-order polar leapfrog filter according to the embodiment of the present invention, which is equivalent to the arrangement of FIG. 1 as will readily be appreciated from the above discussion. The circuits indicated at 12 and 13 in FIG. 8 correspond to the integrator 12 and differentiator 13 of FIG. 3, respectively; thus, it will be readily apparent that the circuits 21 and 23, each of which comprises the integrator 12 and differentiator 13, correspond to the polar networks described above with reference to FIG. 3. In FIG. 8, reference numerals 20, 22 and 24 indicate integrators comprising variable transconductance amplifiers $G_1$, $G_i$, and $G_n$ having the output terminals thereof grounded through capacitors $C_1$, $C_i$ and $C_n$ respectively. Each of the integrators 20, 22 and 24 corresponds to the integrator 12, and only the integrator 20 is constructed in the form of self negative feedback type. Furthermore, negative feedback is provided in the form of leapfrog from the output side integrator 24 to the immediately preceding polar network 23, from the polar network 23 to the immediately preceding integrator 22, from the integrator 22 to the immediately preceding polar network 21, and from the polar network 21 to the integrator 20 at the input. In this case, the sum of the number of the integrators and the number of the polar networks is odd and equal to the order of the filter, and it is possible to increase the order of the polar leapfrog filter by increasing the number of the combinations of the polar network (such as 21, 23) and integrator (such as 22, 24) which are connected to each other as indicated by dotted lines.

Figure 11:
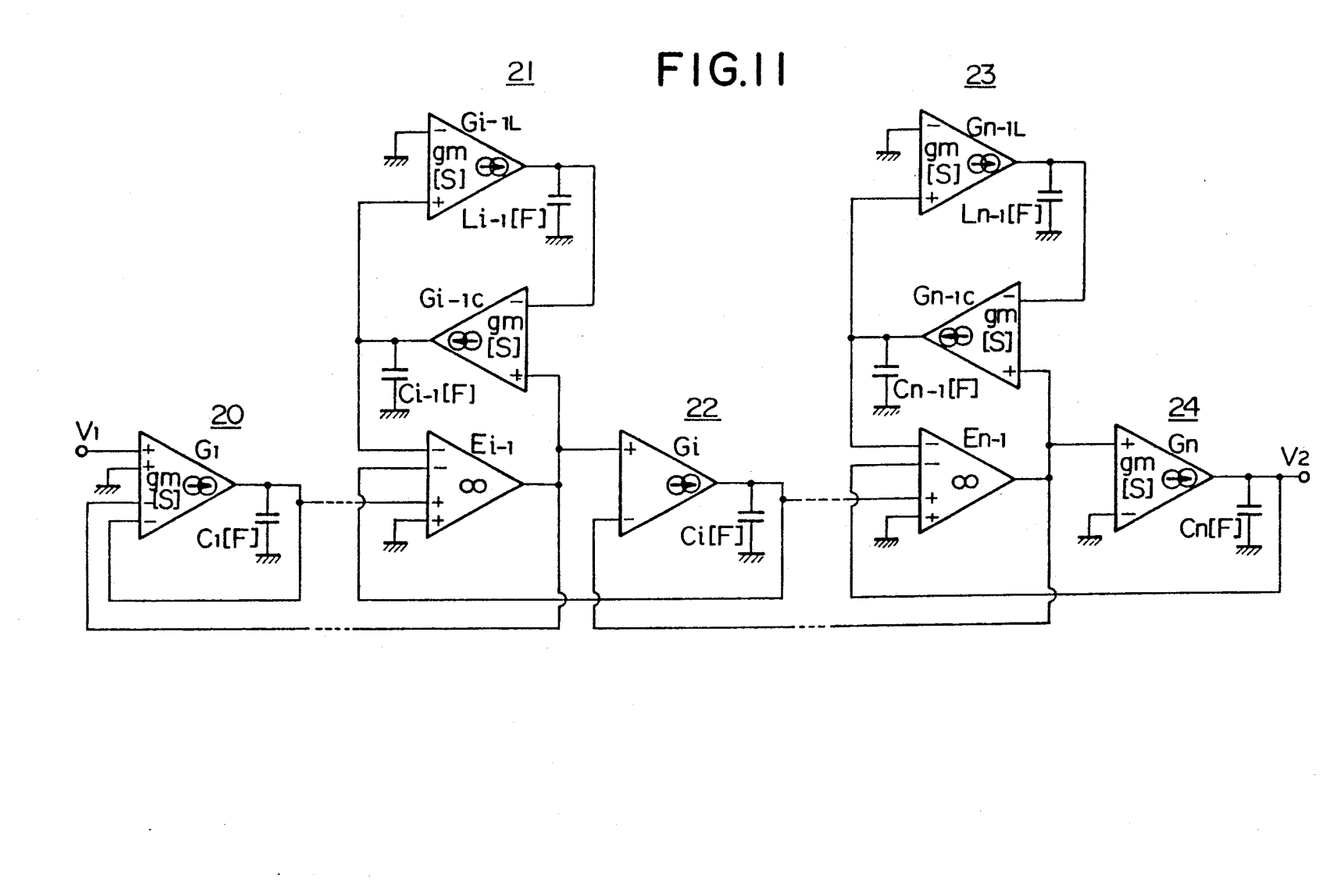
FIG. 11 is a circuit diagram showing the polar leapfrog filter according to another embodiment which is constructed by transforming the passive filter shown in FIG. 2.

Referring to FIG. 2, there is shown a conventional odd-order passive LPF (low-pass filter) having a terminal resistor, which is identical with the arrangement of FIG. 1 except that the terminal resistor is provided. FIG. 11 illustrates the polar leapfrog filter according to another embodiment of the present invention, which is achieved by transforming the passive filter of FIG. 2, like that of FIG. 1, to an active filter in accordance with the leapfrog simulation procedure.

Figure 9:
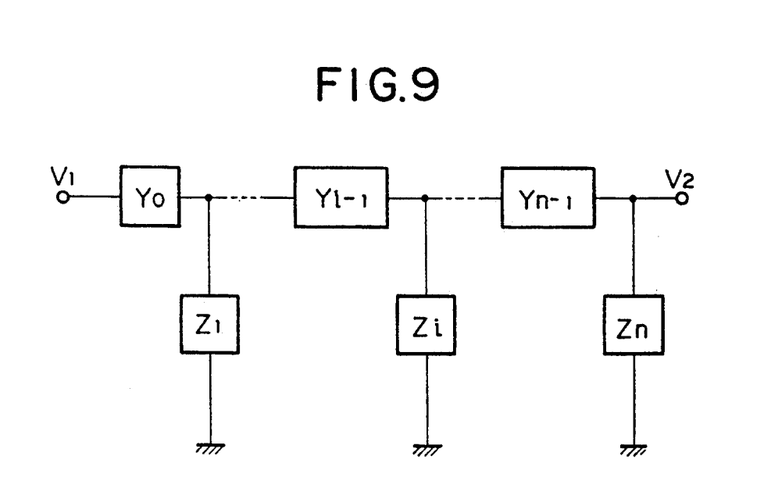
FIG. 9 illustrates the arrangement of FIG. 2 as subjected to scaling and represented by using admittance and impedance.

The arrangement of FIG. 2 is transformed to such an arrangement as shown in FIG. 9, by carrying out the scaling procedure and then representing the floating elements by admittance Y and the grounded elements by impedance Z as in the case of FIG. 1. In this case, too, the admittance and impedance can be regarded as transfer functions; thus, the transfer functions are given by equations (14) as follows:

$$T_0 = 1$$

$$T_1 = gm/sC_1$$

$$T_{i-1} = sC_{i-1}/gm + gm/sL_{i-1}$$

$$T_i = gm/sC_i$$

$$T_{n-1} = sC_{n-1}/gm + gm/sL_{n-1}$$

$$T_n = gm/(sC_n + gm) \tag{14}$$

Figure 10A:
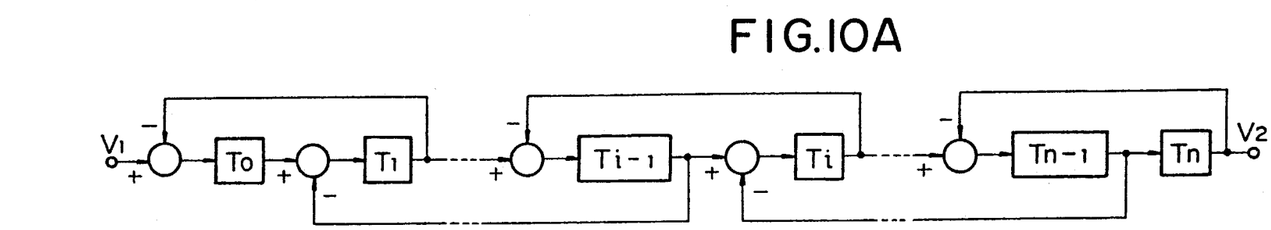
FIG. 10A illustrates signal flow developed in accordance with the leapfrog simulation procedure.

The arrangement of FIG. 9 can be developed into such a signal flow as shown in FIG. 10A, in accordance with the leapfrog simulation procedure disclosed in the "Analog Filter Design" cited in the preamble portion of the present specification. In FIG. 10A, the characters indicated in the respective blocks correspond to the transfer functions represented by the equations (14) respectively, and the circles represent adders.

Figure 10B:
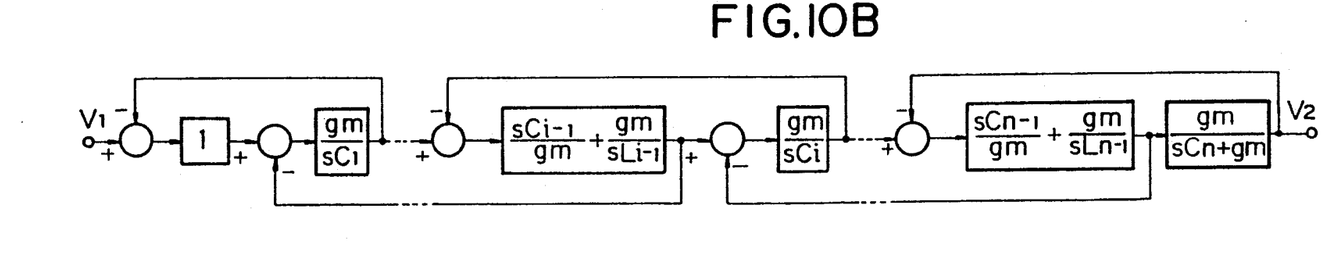
FIG. 10B illustrates an arrangement transformed from that of FIG. 10A.

By putting the equations (14) in the respective blocks of FIG. 10A, the arrangement of FIG. 10A is transformed to that of FIG. 10B. Recall that the arrangement of FIG. 4A can be transformed to the arrangement of FIG. 4D as mentioned hereinbefore; by putting such relationship in FIG. 10B, the arrangement of FIG. 10B can be transformed to that of FIG. 10C.

Figure 10C:
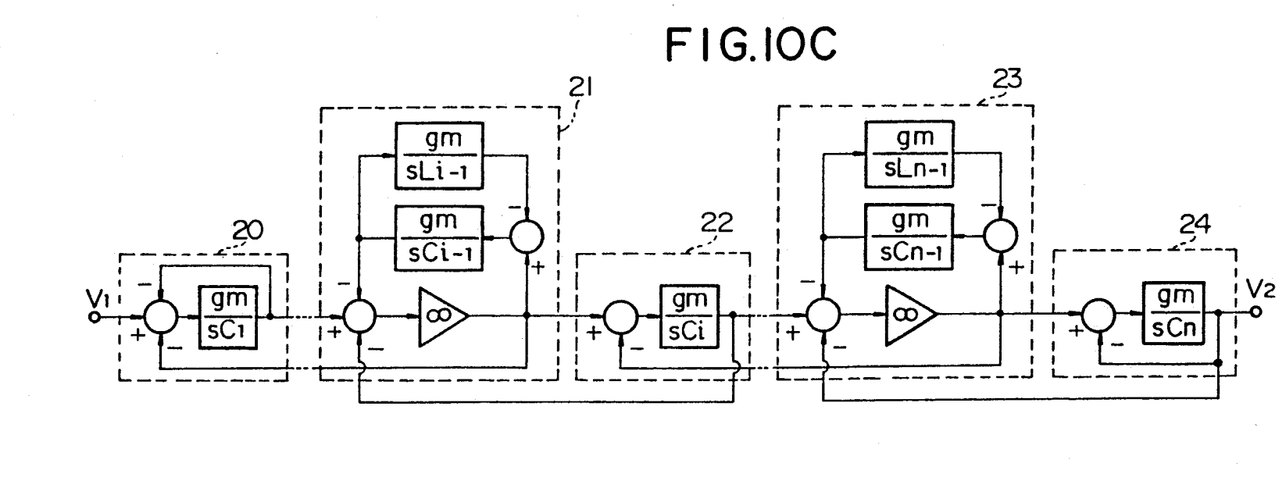
FIG. 10C illustrates an arrangement transformed from that of FIG. 10B.

As in the case of the embodiment shown in FIG. 8, the arrangement of FIG. 10C can be transformed to the arrangement of FIG. 11 constituting the odd-order polar leapfrog filter according to the second embodiment of the present invention which is equivalent to the arrangement of FIG. 2. The embodiment of FIG. 11 is different from the embodiment of FIG. 8 only in that the output side integrator 24 is constructed as self negative feedback type, which corresponds to the fact that the filter of FIG. 2 has a terminal resistor.

Figure 12:
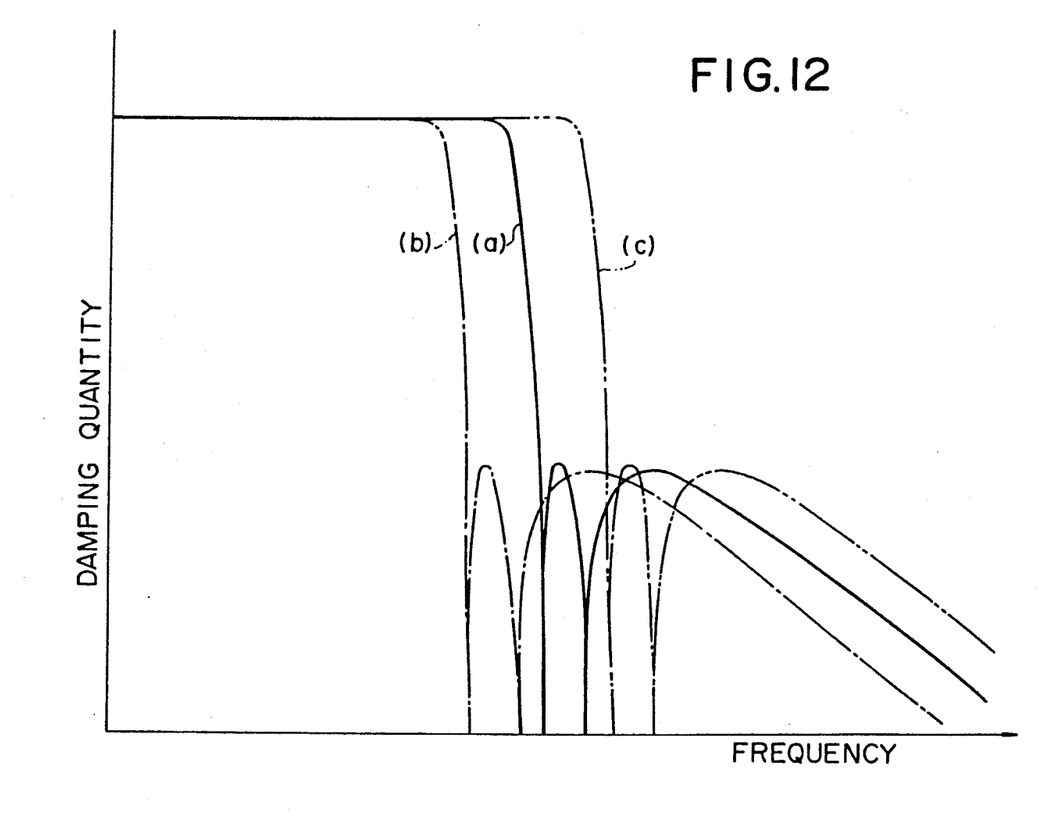
FIG. 12 illustrates the frequency characteristics of the embodiments shown in FIGS. 8 and 11.

FIG. 12 illustrates the frequency characteristics of the polar leapfrog filters shown in FIGS. 8 and 11, pass band of which is changed as indicated by (a), (b) and (c) as the transconductance gm of the variable transconductance amplifier constituting the integrator is changed to 1, 0.5 and 2 mS (Simens or Mho) by changing the operating current flowing through the differential transistor pair of the variable transconductance amplifier.

While the present invention has been illustrated and described with respect to specific embodiments thereof, it is to be understood that the present invention is by no means limited thereto but encompasses all changes and modifications which will become possible within the scope of the appended claims.

We claim:

1. A polar leapfrog filter including a polar network which comprises a differentiator constituted by an operational amplifier having input and output terminals, and a first integrator for providing negative feedback to said operational amplifier, said first integrator comprising a first capacitor and a first variable transconductance amplifier; and a second integrator for providing negative feedback to said first integrator, said second integrator comprising a second capacitor, and a second variable transconductance amplifier.

2. A polar leapfrog filter according to claim 1, wherein the integrator is constructed at the input side of said polar network.

3. A polar leapfrog filter according to claim 1, wherein both of the integrators are constructed at the input side and output side of said polar network.

4. A polar leapfrog filter including at least one polar network which comprises a differentiator constituted by an operational amplifier having input and output terminals, and a first integrator for providing negative feedback to said operational amplifier, said first integrator comprising a first capacitor and a first variable transconductance amplifier; and a second integrator for providing negative feedback to said first integrator, said second integrator comprising a second capacitor and a second variable transconductance amplifier, and integrators provided at the input and output sides of said filter respectively, wherein the total number of the circuits is selected to provide an odd order and equal order for the filter, and adjacent ones of the circuits are connected with each other in such a manner that leapfrog type negative feedback is effected.

5. A polar leapfrog filter including a plurality of polar networks, each of which comprises a differentiator constituted by an operational amplifier having input and output terminals, and a first integrator for providing negative feedback to said operational amplifier, said first integrator comprising a first capacitor and a first variable transconductance amplifier; and a second integrator for providing negative feedback to said first integrator, said second integrator comprising a second capacitor and a second variable transconductance amplifier; integrators provided at the input and output sides of said filter respectively; and a further integrator provided between said polar networks, wherein the total number of the circuits is selected to provide an odd order and equal order for the filter, and adjacent ones of the circuits are connected with each other in such a manner that leapfrog type negative feedback is effected.

6. A polar leapfrog filter according to claim 5, wherein the integrator provided at the input side is constructed in the form of self negative feedback type.

7. A polar leapfrog filter according to claim 5, wherein both of the integrators provided at the input side and output side are constructed in the form of self negative feedback type.

* * * * *